United States Patent
Maemura et al.

[11] Patent Number: 5,760,652
[45] Date of Patent: Jun. 2, 1998

[54] INTEGRATED CIRCUIT DEVICE

[75] Inventors: Koosei Maemura; Kazuya Yamamoto, both of Tokyo, Japan

[73] Assignee: Mitsubishi Denki Kabushiki Kaisha, Tokyo, Japan

[21] Appl. No.: 716,051

[22] Filed: Sep. 19, 1996

[30] Foreign Application Priority Data

Jun. 6, 1996 [JP] Japan ................................. 8-144003

[51] Int. Cl.⁶ .................................................. H03F 3/16
[52] U.S. Cl. ............................................ 330/297; 330/307
[58] Field of Search ............................. 330/51, 277, 296, 330/297, 307

[56] References Cited

U.S. PATENT DOCUMENTS

| | | | |
|---|---|---|---|
| 5,199,079 | 3/1993 | Anderson et al. | 330/297 X |
| 5,450,037 | 9/1995 | Kanaya et al. | 330/297 |
| 5,627,458 | 5/1997 | Nevin | 323/267 |

FOREIGN PATENT DOCUMENTS 2290335  11/1990  Japan .

*Primary Examiner*—Steven Mottola
*Attorney, Agent, or Firm*—Leydig, Voit & Mayer, Ltd.

[57] ABSTRACT

An integrated circuit device includes a power amplifier having an FET; a negative voltage generator for supplying a negative voltage to the power amplifier; a power supply terminal receiving a positive power supply voltage through an external switch and applying the positive power supply voltage to the negative voltage generator and, through an internal switch, to the power amplifier; and a negative voltage detector for detecting the negative voltage output from the negative voltage generator and sending a control signal to the internal switch so that the internal switch is closed when the output voltage from the negative voltage generator is lower than a threshold negative voltage and open when the output voltage is higher than the threshold negative voltage. It is not necessary to supply an external negative voltage as a gate bias voltage of the FET. Since the positive power voltage is applied to both the power amplifier and the negative voltage generator, an external power supply control circuit outputs only one control signal to control the external switch. It is not necessary to set a time interval from application of the power supply voltage to the negative voltage generator until application of the power supply voltage to the power amplifier in advance so that power dissipation is significantly reduced.

10 Claims, 5 Drawing Sheets

INTEGRATED CIRCUIT DEVICE

FIELD OF THE INVENTION

The present invention relates to an integrated circuit device used for radiocommunication, in which a power amplifier and a control circuit for the power amplifier are integrated.

BACKGROUND OF THE INVENTION

In order to improve the portability of a wireless telephone, especially a portable telephone, a reduction in the size of the telephone has been demanded. For this purpose, a reduction in the number of parts constituting the telephone, i.e., an increase in the integration density of functional elements, has been promoted.

Since a portable telephone uses a frequency of 0.9 GHz or 1.5 GHz and a PHS (personal handy phone system) uses a frequency of 1.9 GHz, a GaAs element is used as a power amplifier because a GaAs element consumes less power in such a high frequency band than an Si element. Generally, a GaAs element used as a power amplifier in a telephone is a field effect transistor and, in this case, a negative voltage, for example, −2V, is needed.

FIG. 7 shows an example of a power amplifier circuit employing a GaAs element. In FIG. 7, reference numeral 1 designates a power amplifier and numeral 2 designates a negative voltage generator. Reference characters $V_{DD1}$ and $V_{DD2}$ designate positive power supply terminals, characters IN and OUT designate an input terminal and an output terminal of the power amplifier circuit, respectively, character $V_{SS}$ designates a negative voltage output from the negative voltage generator 12, characters NI, NO, ND, and NG designate an input terminal, an output terminal, a power supply terminal, and a gate bias terminal of the power amplifier 1, respectively, and character $V_G$ designates a gate bias voltage applied to the power amplifier 1. Further, characters R1 and R2 designate resistors that divide the negative voltage $V_{SS}$ to produce the gate bias voltage $V_G$. For example, when $V_{SS}$ is −3V and $V_G$ is desired to be −2V, the resistors R1 and R2 should have resistances of 20 kΩ and 10 kΩ, respectively.

In this power amplifier circuit, the power amplifier 1 and the negative voltage generator 2 are constituted by different integrated circuits (hereinafter referred to as ICs). More specifically, since only the power amplifier 1 operates at a high frequency, the amplifier 1 is constituted by a GaAs element (FET), and the negative voltage generator 2 is constituted by a C-MOS (Complementary Metal-Oxide Semiconductor) circuit using an Si element that can suppress power dissipation. Since a C-MOS circuit has the advantage that the power required is extremely low, even when a supply voltage is constantly applied to the power supply terminal $V_{DD2}$, there is no problem in power consumption.

When the negative voltage generator 2 and the power amplifier 1 are integrated in an IC to reduce circuit size, a GaAs element operating at a high frequency is included in this IC. However, since it is difficult to constitute a circuit similar to a C-MOS circuit using GaAs elements, power dissipation is unfavorably increased. In order to suppress power dissipation, it is desired that the power supply voltage be applied to the power supply terminal $V_{DD2}$ of the negative voltage generator 2 only when the negative voltage $V_{SS}$ is needed. However, since the gate bias voltage $V_G$ for the power amplifier 1 is produced in response to $V_{SS}$, if the power supply voltage is applied to the power supply terminal of the power amplifier 1 before the gate bias voltage $V_G$ reaches a prescribed voltage, a large current flows in the power amplifier 1, resulting in an increase in current dissipation. The reason for this current increase is given in the following. That is, since a current flowing between a source and a drain of an FET that constitutes the power amplifier is almost proportional to $V_{th}$ (threshold voltage)−$V_G$, when $V_{th}$ is −3V and $V_G$ required for operating the power amplifier is −2V, 0V is given as $V_G$ before $V_{SS}$ is generated. In this case, $V_{th}$−VG increases, and unnecessary current flows in the power amplifier.

FIG. 8 shows an IC 104 including a power amplifier 1 and a negative voltage generator 2, and an external power supply control circuit 103 that controls a power supply for the IC 104. In the figure, the same reference numerals as those shown in FIG. 7 designate the same parts. Reference characters SW1 and SW2 denote switches that control application of a positive power supply voltage to the IC 104 in response to control signals $CTL_1$ and $CTL_2$ from the control circuit 3.

In this circuit, a negative voltage $V_{SS}$ must be produced before a positive power supply voltage is applied to the power supply terminal $V_{DD1}$ of the power amplifier 1 by applying the power supply voltage to the power supply terminal $V_{DD2}$ of the negative voltage generator 2 before it is applied to the terminal $V_{DD1}$. For this purpose, control signals $CTL_2$ and $CTL_1$ must be generated to turn on the switch $SW_2$ before turning on the switch $SW_1$.

As described above, in the IC 104 in which the power amplifier 1 and the negative voltage generator 2 are integrated, two control signals $CTL_1$ and $CTL_2$ are required to control the power supply voltage applied to the power amplifier and the negative voltage generator 2.

FIG. 9 is a timing chart for explaining the operation of the IC 104. In FIG. 9, waveforms of signals applied to the respective terminals are shown. An interval T between the control signal $CTL_1$ and the control signal $CTL_2$ must be longer than a period T1 during which the control signal $CTL_2$ becomes high, the switch $SW_2$ turns on, a power supply voltage is applied to the terminal $V_{DD2}$, the negative voltage generator 2 generates $V_{SS}$, and a gate bias voltage $V_G$ is set. Furthermore, the interval T must be sufficiently long so that variations in the timing of generating $V_{SS}$ in the negative voltage generator 2 are ignored. That is, when an expected maximum value of a variation of T1 is ΔT1, considering a margin for ΔT1, T must be larger than T1+ΔT1. However, in many cases, the gate bias voltage $V_G$ is set at a desired value in a time interval equivalent to T1 after the control signal $CTL_2$ becomes "H". So, even when T is equal to T1+ΔT1, during the period ΔT1, power is continuously consumed in the negative voltage generator 2 although the power amplifier 1 is not operated. That is, since the time interval from application of the power supply voltage to the negative voltage generator 2 to application of the power supply voltage to the power amplifier 1 is set in advance while taking such a margin as mentioned above into consideration, unnecessary power dissipation occurs in the negative voltage generator 2 during the time interval for this margin.

SUMMARY OF THE INVENTION

It is an object of the present invention to provide an IC device that reduces the number of signals for controlling a power supply to one and that suppresses power dissipation in a negative power generator and a power amplifier.

Other objects and advantages of the invention will become apparent from the detailed description that follows.

The detailed description and specific embodiments described are provided only for illustration since various additions and modifications within the spirit and scope of the invention will be apparent to those of skill in the art from the detailed description.

According to a first aspect of the present invention, an integrated circuit device comprises a power amplifier comprising an FET that includes a channel layer and has a gate length, a gate width, a depth of the channel layer, and a dopant concentration of the channel layer; a negative voltage generator supplying a negative voltage to the power amplifier; an internal switch; a power supply terminal receiving a positive power supply voltage through an external switch and applying the positive power supply voltage to the negative voltage generator and, through the internal switch, to the power amplifier; and a negative voltage detector detecting the negative voltage output from the negative voltage generator and sending a control signal to the internal switch so that the internal switch is turned on when the output voltage from the negative voltage generator is lower than a prescribed negative voltage and the internal switch is turned off when the output voltage is higher than the prescribed negative voltage. Since the power amplifier and the negative voltage generator are included in this integrated circuit device, it is not necessary to supply a negative voltage, as a gate bias voltage of an FET used as the power amplifier, from the outside. In addition, since the positive power supply voltage is applied to both the power amplifier and the negative voltage generator through the external switch and the power supply terminal, an external power supply control circuit outputs only one control signal to control the external switch whereas two control signals are required to control two external switches in the prior art integrated circuit device shown in FIG. 8. Further, the negative voltage output from the negative voltage generator is detected by the negative voltage detector and, only when the negative voltage is lower than a prescribed negative voltage, the positive power supply voltage is applied to the power amplifier. So, it is not necessary to set a time interval from application of the power supply voltage to the negative voltage generator to application of the power supply voltage to the power amplifier in advance, considering a margin for variations in the timing of generating the negative voltage, as in the prior art device shown in FIG. 8. Therefore, the time interval during which the power supply voltage is applied to only the negative voltage generator and the power is dissipated in the negative voltage generator whereas the power supply voltage is not applied to the power amplifier, i.e., the power amplifier is not operated, is significantly reduced as compared with the prior art device, whereby power dissipation in the integrated circuit device is reduced.

According to a second aspect of the present invention, an integrated circuit device comprises a power amplifier having a power supply terminal; a negative voltage generator supplying a negative voltage to the power amplifier; a first power supply terminal receiving a positive power supply voltage through an external switch and supplying the positive power supply voltage to a power supply terminal of the power amplifier; a second power supply terminal receiving a positive power supply voltage through a second external switch and supplying the positive power supply voltage to the negative voltage generator; and a negative voltage detector detecting the negative voltage output from the negative voltage generator and sending a control signal to the first external switch so that the first external switch is turned on when the output voltage from the negative voltage generator is lower than a prescribed negative voltage and the first external switch is turned off when the output voltage is higher than the prescribed negative voltage. Since the power amplifier and the negative voltage generator are included in this integrated circuit device, it is not necessary to supply a negative voltage, as a gate bias voltage of an FET constituting the power amplifier, from the outside. Further, although the positive power supply voltage is applied through the first external switch to the first power supply terminal connected to the power amplifier, since a signal for controlling this switch is supplied from the negative voltage detector included in the integrated circuit device, it is not necessary for an external power supply control circuit to output two control signals as in the prior art integrated circuit device shown in FIG. 8, i.e., the power supply control circuit outputs a control signal for controlling the second external switch. Furthermore, the negative voltage output from the negative voltage generator is detected by the negative voltage detector and, only when the negative voltage is lower than a prescribed negative voltage, the positive power supply voltage is applied to the power amplifier. So, it is not necessary to set a time interval from application of the power supply voltage to the negative voltage generator to application of the power supply voltage to the power amplifier in advance, considering a margin for variations in the timing of generating the negative voltage, as in the prior art device shown in FIG. 8. Therefore, the time interval during which the power supply voltage is applied to only the negative voltage generator and the power is dissipated in the negative voltage generator whereas the power supply voltage is not applied to the power amplifier, i.e., the power amplifier is not operated, is significantly reduced as compared with the prior art device, whereby power dissipation in the integrated circuit device is reduced. Furthermore, since the switch connected to the first power supply terminal is disposed outside the integrated circuit device, an FET having a wide gate and a low ON resistance can be used as the switch, whereby unwanted increase in power loss is avoided without increasing the size of the device.

According to a third aspect of the present invention, the integrated circuit device mentioned above further includes a capacitor connected between the power supply terminal of the power amplifier and the ground. Therefore, the power supply is stabilized.

According to a fourth aspect of the present invention, in the integrated circuit device mentioned above, the negative voltage detector comprises an input circuit and an inverter circuit. The input circuit comprises a normally off type first FET having a gate, a drain, and a source receiving the output voltage from the negative voltage generator; a first load circuit connected between the drain of the first FET and the positive power supply terminal; and a voltage drop circuit producing a desired voltage drop such that the voltage at the gate becomes lower than the ground voltage. The inverter circuit comprises a normally off type second FET having a gate, a drain, and a source, the gate being connected to the drain of the first FET, and the drain outputting the control signal; and a second load circuit connected between the drain of the second FET and the positive power supply terminal. Therefore, a signal for controlling the switch can be changed from low to high when the output voltage from the negative voltage generator becomes lower than a prescribed negative voltage, so that generation of a negative voltage in the negative voltage generator is easily detected.

According to a fifth aspect of the present invention, in the integrated circuit device mentioned above, the voltage drop circuit comprises a plurality of diodes connected in series with anodes thereof facing the ground. Therefore, a desired voltage drop is easily made in this voltage drop circuit.

According to a sixth aspect of the present invention, in the integrated circuit device mentioned above, the voltage drop circuit comprises a diode and an FET having short-circuited gate and drain, and the transistor and the diode are connected in series with the drain of the transistor and an anode of the diode facing the ground. Therefore, a desired voltage drop is easily made in this voltage drop circuit. Further, the voltage drop can be made smaller than the voltage drop in the above-mentioned voltage drop circuit comprising two diodes. Thereby, a time interval from application of the power supply voltage to the power supply terminal of the integrated circuit device to application of the power supply voltage to the power amplifier can be reduced, so that the power supply voltage can be applied to the integrated circuit device just before the operation of the power amplifier, resulting in a reduction in the power dissipation.

According to a seventh aspect of the present invention, in the integrated circuit device mentioned above, the negative voltage detector is an inverter circuit comprising a normally on FET having the same depth and dopant concentration of a channel layer as those of the FET constituting the power amplifier, and a load circuit connected between the drain of the normally on FET and the positive power supply terminal. The normally on FET includes a gate receiving the output voltage from the negative voltage generator and a drain outputting the control signal. In this structure, since the number of the elements constituting the negative voltage generator is reduced, the size of the integrated circuit device is reduced, resulting in a reduction in the cost. Furthermore, since the channel layer of the FET constituting the power amplifier and the channel layer of the FET constituting the negative voltage generator can be simultaneously fabricated, whereby the fabrication process is simplified.

According to an eighth aspect of the present invention, in the integrated circuit device mentioned above, the normally on type FET has the same gate length, the same depth of the channel layer, and the same dopant concentration of the channel layer as those of the FET constituting the power amplifier, and a gate width larger than 10 µm. Therefore, the threshold voltage of the normally on FET can be made equal to the threshold voltage of the FET constituting the power amplifier, whereby the negative voltage output from the negative voltage generator is easily detected.

According to a ninth aspect of the present invention, in the integrated circuit device mentioned above, the normally on FET has the same gate length, the same depth of the channel layer, and the same dopant concentration of the channel layer as those of the FET constituting the power amplifier, and a gate width narrower than that of the FET constituting the power amplifier and than 10 µm. Therefore, the threshold voltage of the normally on FET can be made larger than the threshold voltage of the FET constituting the power amplifier, so that the time interval from application of the power supply voltage to the power supply terminal of the integrated circuit device to application of the power supply voltage to the power amplifier can be reduced. So, it is possible to apply the power supply voltage to the integrated circuit device just before the operation of the power amplifier, resulting in a reduction in the power dissipation.

According to a tenth aspect of the present invention, in the integrated circuit device mentioned above, the normally on FET has the same depth and dopant concentration of the channel layer as those of the FET constituting the power amplifier, and a gate length longer than that of the FET constituting the power amplifier and than 2 µm. Therefore, the threshold voltage of the normally on FET can be made larger than the threshold voltage of the FET constituting the power amplifier, so that the time interval from application of the power supply voltage to the power supply terminal of the integrated circuit device to application of the power supply voltage to the power amplifier can be reduced. So, it is possible to supply a power to the integrated circuit device just before the operation of the power amplifier, resulting in a reduction in the power dissipation.

According to an eleventh aspect of the present invention, an integrated circuit device includes a negative voltage detector, and the negative voltage detector comprises an input circuit and an inverter circuit. The input circuit comprises a positive power supply terminal, a normally off first FET having a gate, a drain, and a source receiving an input voltage, a first load circuit connected between the drain of the first FET and the positive power supply terminal, and a voltage drop circuit connected between the gate of the first FET and the ground and producing a desired voltage drop such that the voltage at the gate becomes lower than the ground voltage. The inverter circuit comprises a normally off second FET having a gate connected to the drain of the first FET and a drain outputting an output signal, and a second load circuit connected between the drain of the second FET and the positive power supply terminal. Therefore, the output voltage can be changed from low to high when the input voltage becomes lower than a prescribed negative voltage, and it is easily detected that the input voltage becomes a negative voltage.

According to a twelfth aspect of the present invention, in the integrated circuit device mentioned above, the voltage drop circuit comprising a plurality of diodes connected in series with anodes thereof facing the ground. Therefore, a voltage drop is easily made in the voltage drop circuit.

According to a thirteenth aspect of the present invention, in the integrated circuit device mentioned above, the voltage drop circuit comprises a diode and an FET having short-circuited gate and drain, and the diode and the transistor are connected in series with the drain of the transistor and an anode of the diode facing the ground. Therefore, a desired voltage drop is easily made in this voltage drop circuit. Further, the voltage drop can be made smaller than the voltage drop in the above-mentioned voltage drop circuit comprising two diodes, whereby a reference voltage for detecting that the input voltage becomes a negative voltage can be made higher than a reference voltage of the above-mentioned negative voltage detector comprising two diodes.

DETAILED DESCRIPTION OF THE PREFERRED EMBODIMENTS

Figure 1:
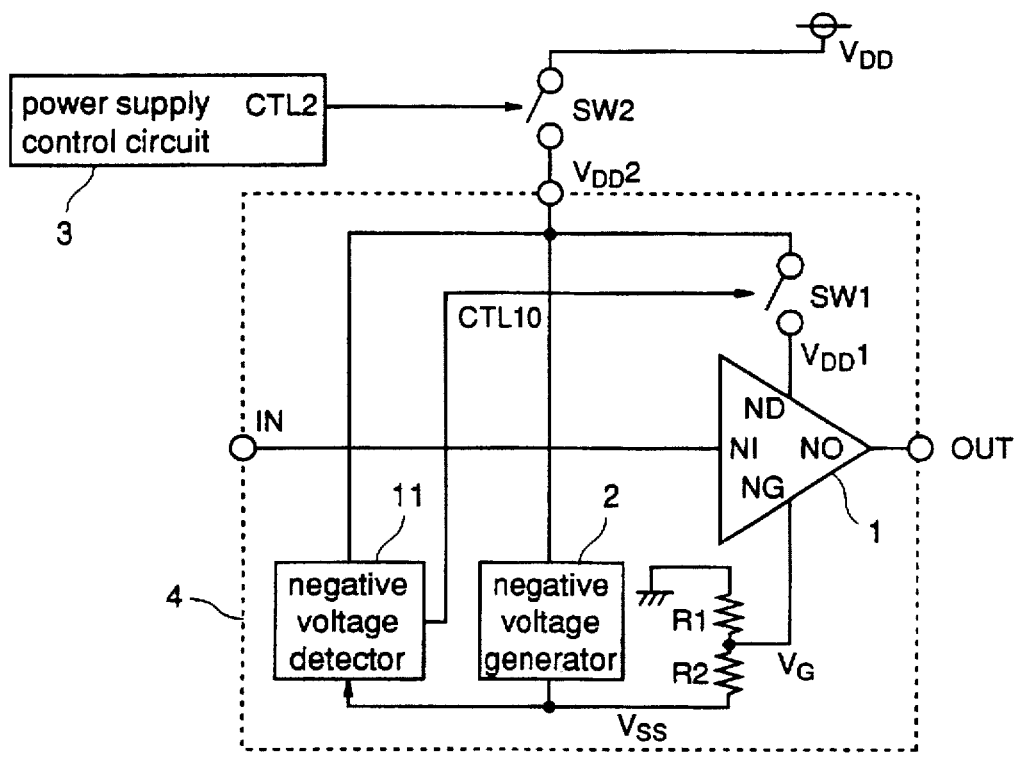
FIG. 1 is a circuit diagram illustrating an IC device according to a first embodiment of the invention and a peripheral circuit.

FIG. 1 is a diagram illustrating an IC device 4 according to a first embodiment of the invention, a switch SW2 for supplying a power supply voltage to the IC device 4, and a power supply control circuit 3 for controlling the switch SW2.

The IC device 4 comprises a power amplifier 1, a negative voltage generator 2, a negative voltage detector 11, a switch SW1, and resistors R1 and R2. A positive power supply voltage is applied to a power supply voltage terminal $V_{DD2}$ of the IC device 4 from an external power supply. In the IC device 4, the power supply voltage is applied to the power amplifier 1 through the switch SW1, to the negative voltage generator 2, and to the negative voltage detector 11. A negative voltage $V_{SS}$ output from the negative voltage generator 11 is subjected to resistive division by the resistors R1 and R2, whereby a gate bias voltage $V_G$ desired for the power amplifier 1 is produced. Reference characters IN and OUT are an input terminal and an output terminal of the IC device 4, respectively, and characters NI, NO, ND, and NG are an input terminal, an output terminal, a power supply terminal, and a gate bias terminal of the power amplifier 1, respectively. The negative voltage detector 11 detects the negative voltage $V_{SS}$ output from the negative voltage generator 2 and outputs a control signal CTL10 that turns on i.e., opens, the switch SW1 when $V_{SS}$ is lower than a prescribed value and turns off i.e., opens, the switch SW1 when $V_{SS}$ is higher than this value.

Further, a positive power supply voltage $V_{DD}$ is applied through the external switch SW2 to the power supply terminal $V_{DD2}$ of the IC device 4, and the switch SW2 is controlled with a control signal CTL2 output from the external power supply control circuit 3.

A description is given of the operation of the IC device 4. Initially, when the control signal CTL2 turns high from low, the switch SW2 turns on, i.e., closes, and a power supply voltage $V_{DD}$ is applied to the power supply terminal $V_{DD2}$. Receiving the power supply voltage, the negative voltage generator 2 generates a negative voltage $V_{SS}$. When the negative voltage $V_{SS}$ becomes lower than a prescribed negative voltage, the control signal CTL10 from the negative voltage detector 11 turns high from low, and the switch SW1 turns on. Thereby, the positive power supply voltage is applied to the power amplifier 1, and the power amplifier 1 starts operation.

Figure 8:
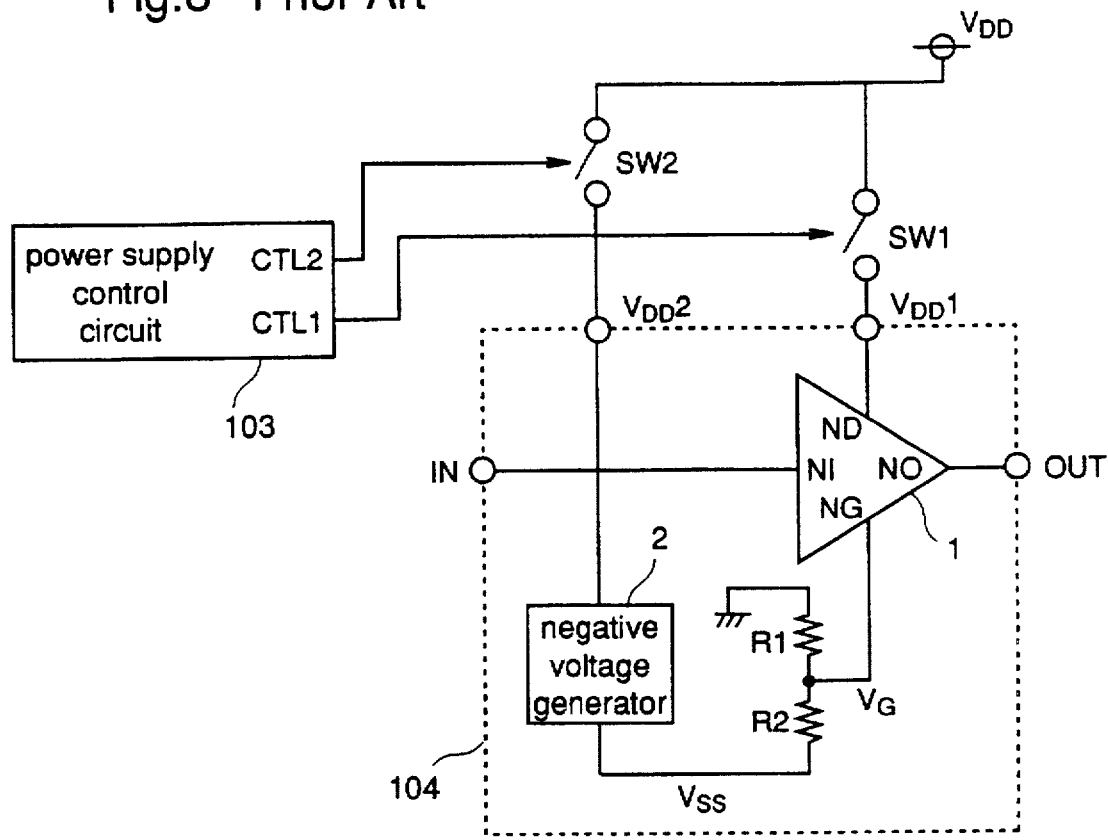
FIG. 8 is a circuit diagram illustrating an IC device including a power amplifier and a negative voltage generator according to the prior art and a peripheral circuit.
Figure 9:
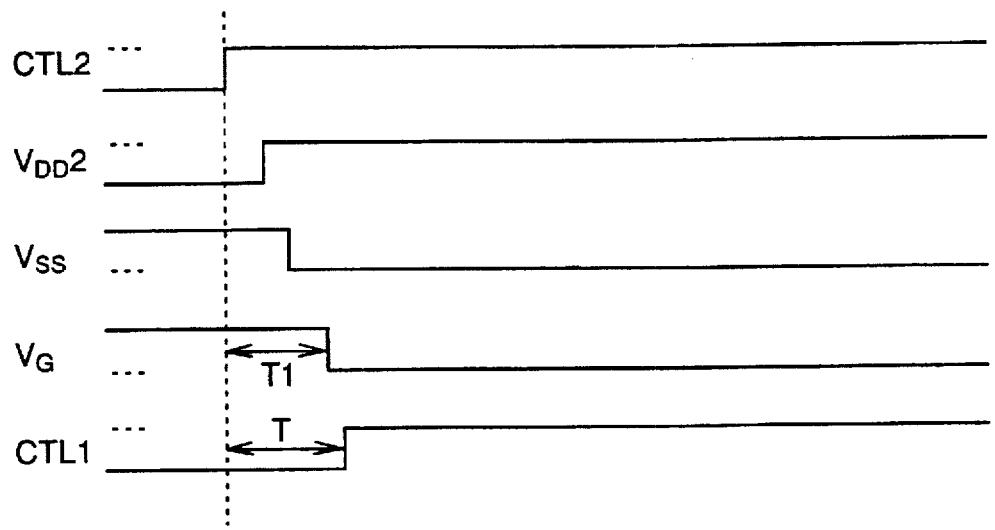
FIG. 9 is a timing chart illustrating control signals and power supply voltages according to the prior art.

According to this first embodiment of the invention, since the power amplifier 1 and the negative voltage generator 2 are included in the IC device 4, it is not necessary to supply a negative voltage, as a gate bias voltage of the FET constituting the power amplifier 1, from the outside. In addition, since a positive power supply voltage is applied to both the power amplifier 1 and the negative voltage generator 2 through the external switch SW2 and the power supply terminal $V_{DD2}$, the external power supply control circuit 3 outputs only one control signal CTL2 to control the SW2 whereas two control signals CTL1 and CTL2 are required to control the switches SW1 and SW2 in the prior art IC device shown in FIG. 8. Further, the negative voltage $V_{SS}$ output from the negative voltage generator 2 is detected by the negative voltage detector 11 and, only when the negative voltage $V_{SS}$ is lower than a prescribed negative voltage, the positive power supply voltage is applied to the power supply terminal $V_{DD1}$ of the power amplifier 1. So, it is not necessary to set a time interval from application of the power supply voltage to the negative voltage generator 2 to application of the power supply voltage to the power amplifier 1 in advance, considering a margin for variations in the timing of generating the negative voltage $V_{SS}$, as in the prior art device shown in FIG. 8. Therefore, the time interval during which the power supply voltage is applied to only the negative voltage generator 2 and the power is dissipated in the negative voltage generator 2 whereas the power supply voltage is not applied to the power amplifier 1, i.e., the power amplifier 1 is not operated, is significantly reduced as compared with the prior art device, whereby power dissipation in the IC device 4 is reduced.

[Embodiment 2]

Figure 2:
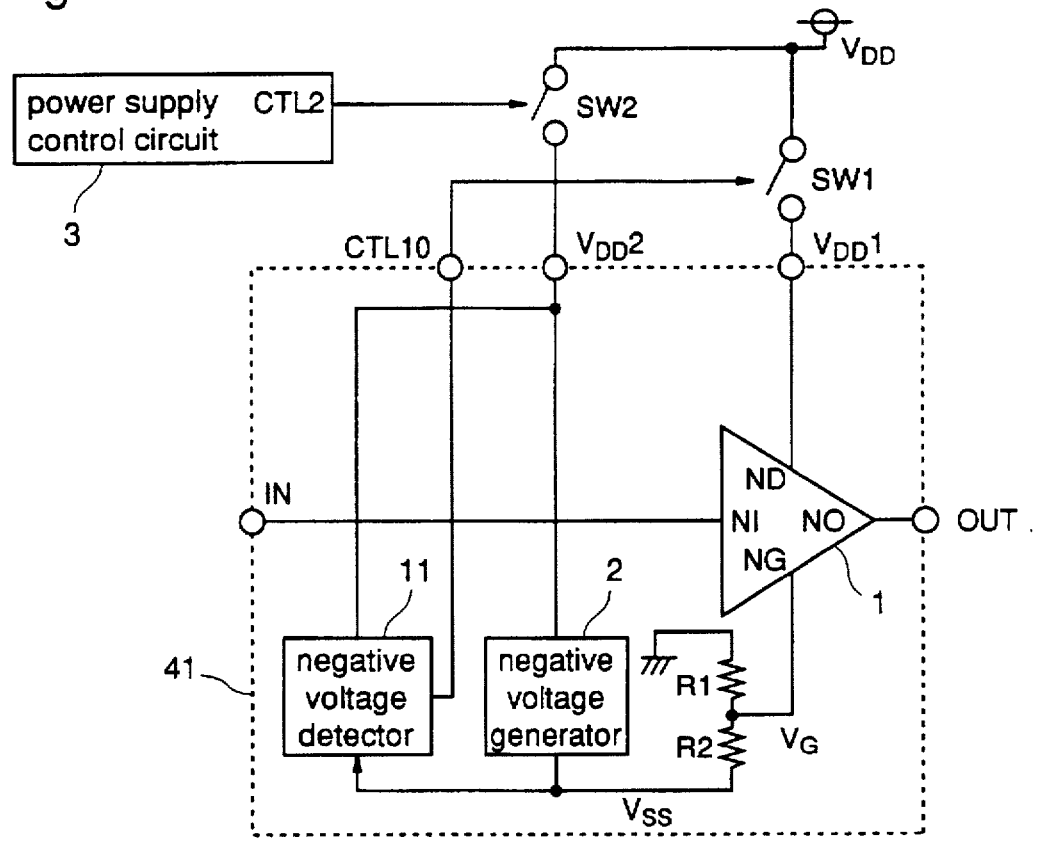
FIG. 2 is a circuit diagram illustrating an IC device according to a second embodiment of the invention and the peripheral circuit.

FIG. 2 is a diagram illustrating an IC device 41 according to a second embodiment of the invention, switches SW1 and SW2 supplying a power supply voltage to the IC device 41, and a power supply control circuit 3. In FIG. 2, the same reference numerals as those shown in FIG. 1 designate the same or corresponding parts.

The IC device 41 according to this second embodiment is different from the IC device 4 according to the first embodiment only in that the switch SW1 is disposed outside the IC device 41 whereas it is included in the IC device 4 according to the first embodiment. So, the IC device 41 has two terminals to which a positive power supply voltage $V_{DD}$ is applied, i.e., $V_{DD1}$ connected to the power amplifier 1 and $V_{DD2}$ connected to the negative voltage generator 2 and the negative voltage detector 11. Further, the IC device 41 has a terminal from which a control signal CTL10 for controlling the switch SW1 is output. A positive power supply voltage $V_{DD}$ is applied to the power supply terminal $V_{DD1}$ through the external switch SW1 and to the power supply terminal $V_{DD2}$ through the external switch SW2. These switches SW1 and SW2 are controlled with a control signal CTL10 output from the negative voltage detector 11 and a control signal CTL2 output from the power supply control circuit 3, respectively.

The operation of the circuit shown in FIG. 2, comprising the IC device 41, the switches SW1 and SW2, and the power supply control circuit 3, is similar to the operation of the circuit shown in FIG. 1.

Generally, in a switch comprising an FET, when it is turned on, i.e., when a positive voltage is applied to a gate of the FET for current flow between a source and a drain, a source to drain resistance (hereinafter referred to as ON resistance) is produced. When this ON resistance is high, power dissipation due to this resistance becomes a problem. Especially when the output from the power amplifier exceeds 1 W, since a current of about 1 A flows into the power amplifier 1 through the switch SW1, the power dissipation due to the ON resistance in the switch SW1 is not negligible. So, it is desired that an FET having a very low ON resistance is used as the switch SW1. However, since the gate width of the FET used as the switch SW1 must be increased to reduce the ON resistance, when this switch SW1 is included in the IC device 41, the chip size of the IC device 41 unfavorably increases with the increase in the gate width, resulting in an increase in the production cost. In this second embodiment of the invention, since the switch SW1 is not included in the IC device 41 but disposed outside the IC device 41, an FET having a wide gate and a low ON resistance can be used as the external switch SW1, whereby an unwanted increase in power loss in the IC device 41 is avoided, resulting in an increase in the power efficiency. Further, the external switch SW1 does not need to operate in a high frequency band. So, an Si-MOSFET may be used as the external switch SW1.

According to the second embodiment of the invention, since the power amplifier 1 and the negative voltage generator 2 are included in the IC device 41, it is not necessary to supply a negative voltage, as a gate bias voltage of the FET constituting the power amplifier 1, from the outside. Further, although a positive power supply voltage is applied through the switch SW1 to the power supply terminal $V_{DD1}$ connected to the power amplifier 1, since a signal for controlling the switch SW1 is supplied from the negative voltage detected included in the IC device 41, the external power supply control circuit 3 does not need to output two control signals as in the prior art IC device shown in FIG. 8. That is, the power supply control circuit 3 outputs only a control signal CTL2. Furthermore, the negative voltage $V_{SS}$ output from the negative voltage generator 2 is detected by the negative voltage detector 11 and, only when the negative voltage $V_{SS}$ is lower than a prescribed negative voltage, the positive power supply voltage is applied to the power supply terminal $V_{DD1}$ of the power amplifier 1. So, it is not necessary to set a time interval from application of the power supply voltage to the negative voltage generator 2 to application of the power supply voltage to the power amplifier 1 in advance, considering a margin for variations in the timing of generating the negative voltage $V_{SS}$, as in the prior art device shown in FIG. 8. Therefore, the time interval during which the power supply voltage is applied to only the negative voltage generator 2 and the power is dissipated in the negative voltage generator 2 whereas the power supply voltage is not applied to the power amplifier 1, i.e., the power amplifier 1 is not operated, is significantly reduced as compared with the prior art device, whereby power dissipation in the IC device 4 is reduced. Furthermore, since the switch SW1 is disposed outside the IC device 41, an FET having a wide gate and a low ON resistance can be used as the switch SW1, whereby an unwanted increase in power loss is avoided without increasing the chip size of the IC device 41.

[Embodiment 3]

Figure 3:
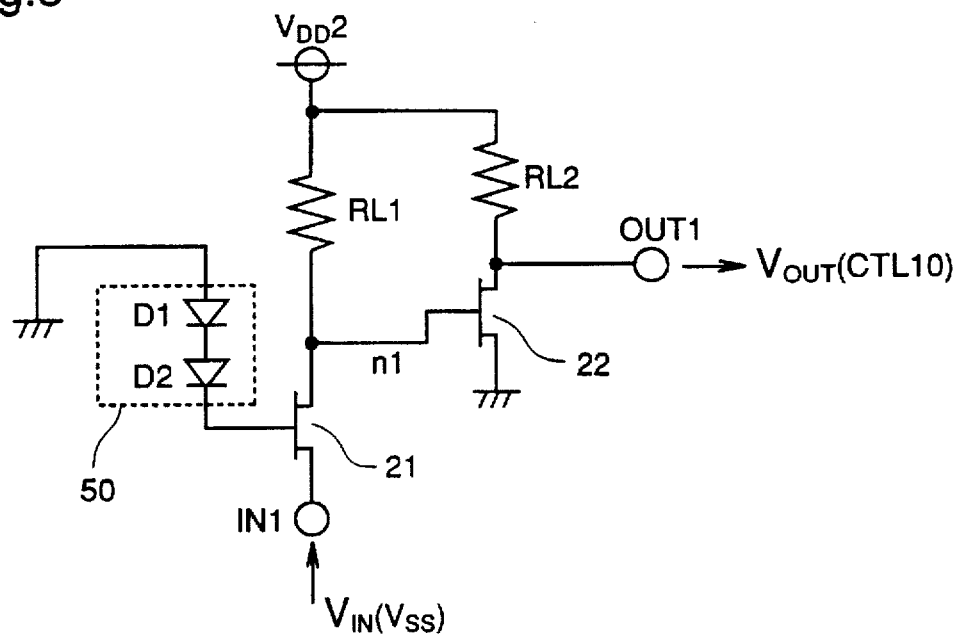
FIG. 3 is a circuit diagram illustrating a negative voltage detector included in an IC device according to a third embodiment of the invention.

FIG. 3 is a circuit diagram illustrating a negative voltage detector included in an IC device according to a third embodiment of the present invention. Although it is not shown in FIG. 3, the circuit structure of the IC device according to this third embodiment is identical to any of the IC devices 4 and 41 shown in FIGS. 1 and 2.

This negative voltage detector comprises an input circuit comprising a normally off FET 21 and a load resistance RL2, and a DCFL (Direct Coupled FET Logic) inverter circuit connected to an output terminal of the input circuit and comprising a normally off FET 22 and a load resistance RL2. Further, a voltage drop circuit 50 for producing a desired voltage drop is connected between a gate of the FET 21 and the ground. The voltage drop circuit 50 comprises two diodes D1 and D2 which are connected in series with anodes connected to ground. A positive power supply voltage $V_{DD}$ is applied to the power supply terminal $V_{DD2}$, and a voltage $V_{IN}$ to be detected is applied to an input terminal IN1 connected to a source of the FET 21. An output terminal OUT1 is connected to a drain of the FET 22. Reference character n1 designates a node of a drain of the FET 21.

The drain of the FET 21 is connected through the load resistance RL1 to the power supply terminal $V_{DD2}$, the gate is connected through the voltage drop circuit 50 to the ground, and the source is connected to the input terminal IN1. Further, an output signal from the drain of the FET 21 is input to the DCFL inverter circuit, and an output signal $V_{OUT}$ from the inverter circuit is emitted from the output terminal OUT1. When the negative voltage detector so constituted is used as the negative voltage detector 11 in the IC devices according to the first and second embodiments, the output signal $V_{OUT}$ corresponds to the signal CTL10 for controlling the switch SW1 and the input signal $V_{IN}$ corresponds to the output $V_{SS}$ from the negative voltage generator 2.

Generally, a logic circuit operates between the lowest voltage and the highest voltage used in the circuit. In the negative voltage detector according to this third embodiment, voltages ranging from a positive voltage to a negative voltage can be input as the input voltage $V_{IN}$ whereas the output voltage varies between 0V and the power supply voltage $V_{DD}$. So the negative voltage detector detects that the input voltage $V_{IN}$ becomes lower than a prescribed negative voltage and changes output voltage.

The operation of the negative voltage in response detector according to the third embodiment of the invention will be described. When a forward bias voltage applied to the diodes D1 and D2 constituting the voltage drop circuit 50 is $V_f$ and the threshold voltage of the FET 21 is $V_{th1}$, the gate voltage of the FET 21 is given by $-2 \times V_f$, and the gate to source voltage $V_{gs1}$ of the FET 21 is given by $-2V_f - V_{IN}$. When $V_{gs1}$ is larger than $V_{th1}$, current flows between the drain and the source of the FET 21, and the voltage at the node n1 becomes low because of the voltage drop due to the load resistance RL1 while the output $V_{OUT}$ from the inverter circuit comprising the FET 22 and the load resistance RL2 becomes high. That is, when the input voltage $V_{IN}$ is lower than $2_f - V_{th1}$, the output voltage $V_{OUT}$ becomes high. On the other hand, when $V_{IN}$ is larger than $2V_f - V_{th1}$, since no current flows between the drain and the source of the FET 21, the voltage at the node n1 becomes high, i.e., equal to $V_{DD}$, and the output voltage $V_{OUT}$ becomes low. Thereby, it is detected that the input voltage $V_{IN}$ becomes lower than a prescribed negative voltage, $-2V_f - V_{th1}$. When this negative voltage detector is used as the negative voltage detector 11 in the IC devices according to the first and second embodiments, the input voltage $V_{IN}$ corresponds to the output voltage $V_{SS}$ from the negative voltage generator 2 and the output voltage $V_{OUT}$ corresponds to the control signal CTL10 for controlling the switch SW1. Therefore, this negative voltage detector detects that $V_{SS}$ is lower than a prescribed negative voltage, and changes the control signal CTL10 from low to high.

While in this third embodiment two diodes D1 and D2 connected in series are used as the voltage drop circuit 50 connected to the gate of the FET 21, the voltage drop circuit 50 may comprise other elements as long as a desired voltage drop is achieved.

Since the negative voltage detector according to this third embodiment of the invention is constituted as shown in FIG. 3, the output voltage $V_{OUT}$ can be changed from low to high when the input voltage $V_{IN}$ becomes lower than a prescribed negative voltage. Further, when this negative voltage detector is employed in the IC devices according to the first and second embodiments of the invention, it is easily detected that the output voltage $V_{SS}$ from the negative voltage generator 2 becomes lower than a prescribed negative voltage.

[Embodiment 4]

Figure 4:
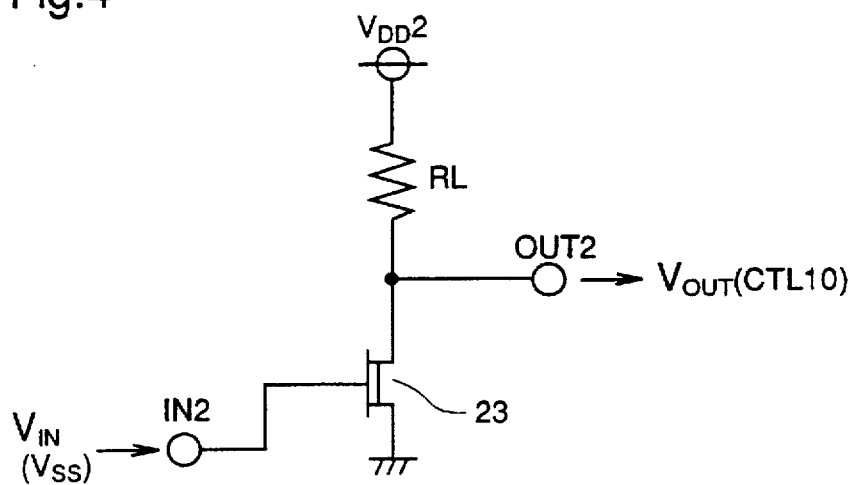
FIG. 4 is a circuit diagram illustrating a negative voltage detector included in an IC device according to a fourth embodiment of the invention.

FIG. 4 is a circuit diagram illustrating a negative voltage detector included in an IC device according to a fourth embodiment of the present invention. Although it is not shown in FIG. 4, the circuit structure of the IC device according to this fourth embodiment is identical to any of the IC devices 4 and 41 shown in FIGS. 1 and 2, respectively.

The negative voltage detector according to this fourth embodiment comprises a normally on FET 23 and a load resistance RL. The normally on FET 23 and the FET used as the power amplifier 1 (hereinafter referred to as amplifier FET 1) have the same gate length, the same depth of a channel layer, and the same dopant concentration in the channel layer. The gate width of the normally on FET 23 is wider than 10 μm. The FET 23 includes a gate connected to an input terminal IN2, a drain connected to the load resistance RL and to an output terminal OUT2, and a source connected to the ground. A positive power supply voltage $V_{DD}$ is applied the power supply terminal $V_{DD2}$. A voltage $V_{IN}$ to be detected, i.e., an output voltage $V_{SS}$ from the negative voltage generator 2, is applied to the input terminal IN2, and an output voltage $V_{OUT}$, i.e., the signal CTL10 for controlling the switch SW1, is output from the output terminal OUT2. This negative voltage detector detects when the input voltage $V_{IN}$ (=$V_{SS}$) becomes lower than a prescribed negative voltage and changes the output voltage. The depth and dopant concentration of the channel layer of the FET 23 can be made equal to those of the channel layer of the amplifier FET 1 by fabricating these channel layers simultaneously in the fabrication process of the IC device. The purpose of a gate width wider than 10 μm is to avoid the narrow channel effect described later.

The operation of the negative voltage detector according to this fourth embodiment will be described. The threshold voltage $V_{th3}$ of the normally on FET 23 is equal to the threshold voltage of the amplifier FET 1. When the input voltage $V_{IN}$ (=$V_{SS}$) is larger than $V_{th3}$, current flows between the source and the drain of the FET 23, and the output signal $V_{OUT}$ (CTL10) becomes low due to a voltage drop of the load resistance RL. On the other hand, when $V_{IN}$ is smaller than $V_{th3}$, since no current flows between the source and the drain of the FET 23, there is no voltage drop occurs by the load resistance RL, so that the output signal $V_{OUT}$ (CTL10) becomes high. Accordingly, when the negative voltage generator 2 does not generate a negative voltage, $V_{SS}$ is larger than $V_{th3}$ and the signal CTL10 for controlling the switch SW1 becomes low. On the other hand, when the negative voltage generator generates a negative voltage, $V_{SS}$ is smaller than $V_{th3}$ and the signal CTL10 becomes high.

According to this fourth embodiment of the invention, the negative voltage detector easily detects when the negative voltage generator 2 generates a negative voltage. Further, since the FET 23 included in the negative voltage detector is a normally on FET, having the same threshold voltage as that of the amplifier FET 1, the number of constituents circuit elements is significantly reduced as compared with the negative voltage detector according to the third embodiment, resulting in a reduction in cost. Furthermore, since the channel layer of the amplifier FET 1 and the channel layer of the FET 23 in the negative voltage detector are fabricated simultaneously, the process of fabricating the IC device is facilitated.

[Embodiment 5]

Figure 5:
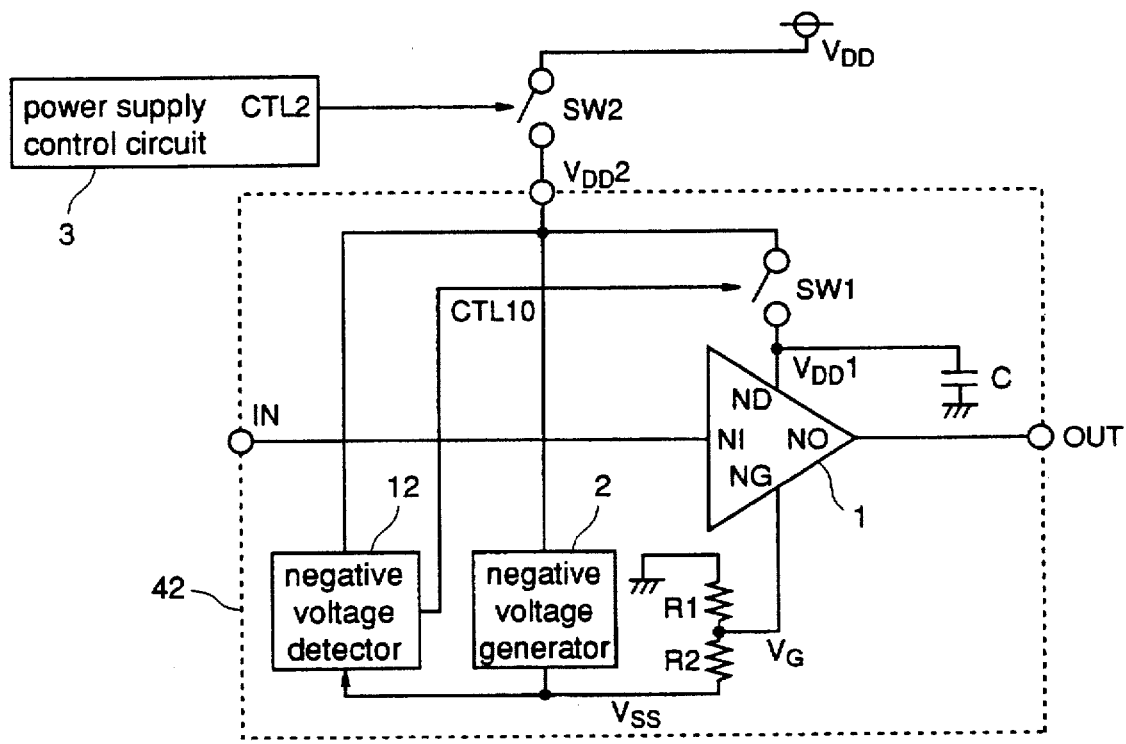
FIG. 5 is a circuit diagram illustrating an IC device according to a fifth embodiment of the invention and a peripheral circuit.
Figure 6:
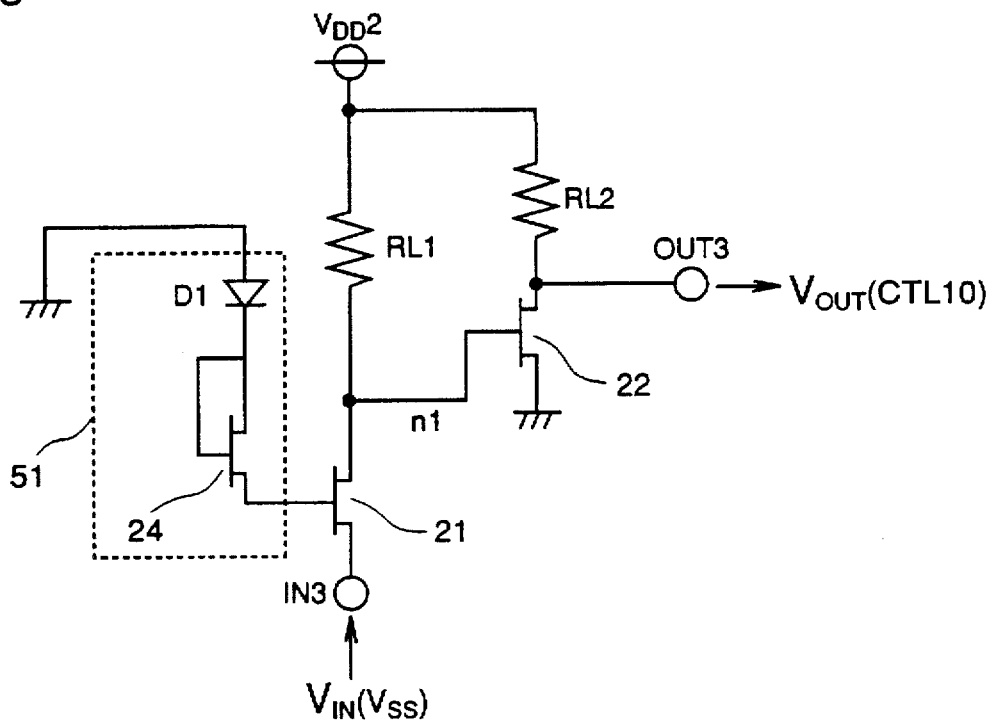
FIG. 6 is a circuit diagram illustrating a negative voltage detector included in the IC device according to the fifth embodiment of the invention.
Figure 7:
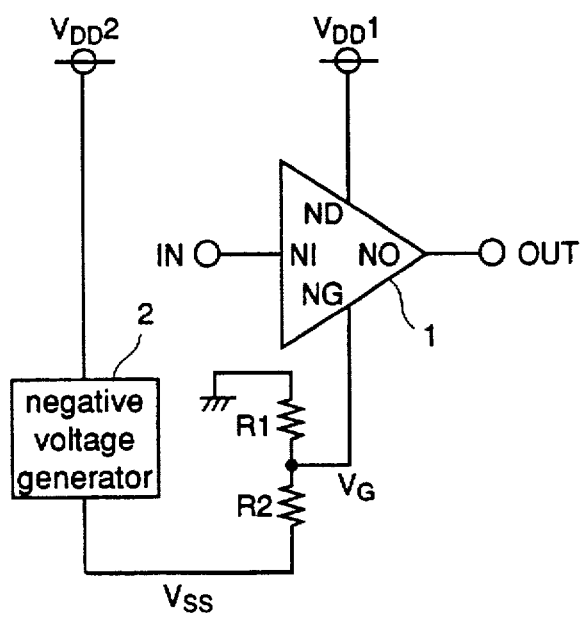
FIG. 7 is a circuit diagram illustrating an example of a connection between a power amplifier and a negative voltage generator according to the prior art.

FIG. 5 is a diagram illustrating an IC device 42 according to a fifth embodiment of the invention, a switch SW2 for supplying a power supply voltage to the IC device 42, and a power supply control circuit 3 for controlling the switch SW2. FIG. 6 shows a negative voltage detector according to this fifth embodiment of the invention. In these figures, the same reference numerals as those shown in FIGS. 1 and 3 designate the same or corresponding parts.

The IC device 42 according to this fifth embodiment is identical to the IC device 4 according to the first embodiment except that a capacitor C for stabilizing the power supply voltage is connected between the power supply terminal $V_{DD1}$ of the power amplifier 1 and the ground, and the timing of detecting the negative voltage by the negative voltage detector is quickened as compared with the negative voltage detector shown in FIG. 1. The capacitor C may be disposed outside the IC device 42.

When the IC device 42 is provided with the capacitor C as shown in FIG. 5, since charging of the capacitor C takes some time after the switch SW1 turns on, it takes a lot of time until the power supply voltage in the power amplifier 1 reaches a prescribed voltage. In order to use this IC device 42 as a power amplifier, it is effective to turn on the switch SW1 and charge the capacitor C even though the negative voltage $V_{SS}$ is not sufficiently low. In this case, a time interval from outputting of the signal CTL2 from the external power supply control circuit 3 to reaching of the power supply voltage in the power amplifier 1 to a prescribed voltage is reduced, so that the switch SW2 may be turned on just before the IC device 42 is operated, whereby unnecessary power dissipation is avoided.

In the negative voltage detector 12, in order to produce the control signal CTL10 for turning on the switch SW1 before the output voltage $V_{SS}$ from the negative voltage generator 2 becomes lower than a prescribed negative voltage, a reduction in the voltage drop in the voltage drop circuit 50, shown in FIG. 3 according to the third embodiment, is considered. FIG. 6 shows a negative voltage detector including such a voltage drop circuit. In FIG. 6, the same reference numerals as those shown in FIG. 3 designate the same or corresponding parts. In the negative voltage detector shown in FIG. 6, an FET 24 is employed in place of the diode D2 in the voltage drop circuit 50 shown in FIG. 3. The FET 24 has a gate and a drain both connected to the cathode of the diode D1, and a source connected to the gate of the FET 21. In the voltage drop circuit shown in FIG. 3, when the forward bias voltage applied to the diodes D1 and D2 is $V_f$, the voltage drop is given by $2 \times V_f$. So, when $V_f$ is 0.7V, the voltage drop is about 1.4V. In the voltage drop circuit 51 show in FIG. 6, since the voltage drop in the FET 24 is equal to the threshold voltage $V_{th}$ of the FET 24, when the threshold voltage $V_{th}$ is 0.1V, the voltage drop between the gate of the FET 21 and the ground is about 0.8V (=$V_f$ (0.7V)+$V_{th}$ (0.1V)). When the threshold voltage of the FET 21 is 0.1V, in the negative voltage detector shown in FIG. 3, the control signal CTL10 does not become high until the voltage $V_{SS}$ becomes lower than −1.5V (=−(1.4+0.1) V). However, in the negative voltage detector according to this fifth embodiment, when the voltage $V_{SS}$ becomes about 0.9V (=−(0.8+0.1) V), current flows between the source and the drain of the FET 21, and the voltage at the node n1 decreases, whereby the output voltage $V_{OUT}$, i.e., the control signal CTL10, becomes high.

According to the fifth embodiment of the invention, a capacitor C for stabilizing the power supply voltage is connected to the power supply terminal $V_{DD1}$ of the power amplifier 1, and the voltage drop in the voltage drop circuit 51 included in the negative voltage detector 12 is made smaller than the voltage drop in the voltage drop circuit 50 according to the third embodiment. Therefore, the time interval from application of the power supply voltage to the power supply terminal $V_{DD2}$ of the IC device to application of the power supply voltage to the power amplifier 1 is reduced as compared with the negative voltage detector according to the third embodiment of the invention, whereby the power supply voltage can be applied just before the operation of the power amplifier 1, resulting in a reduction in power dissipation.

[Embodiment 6]

A description is given of an IC device according to a sixth embodiment of the invention. A negative voltage detector according to this sixth embodiment is identical to the negative voltage detector shown in FIG. 4 according to the fourth embodiment except that the threshold voltage $V_{th3}$ of the FET 23 is increased to quicken the detection of the negative voltage $V_{SS}$. The circuit structure of the IC device according to this sixth embodiment is identical to the IC device shown in FIG. 5 according to the fifth embodiment except for the internal structure of the negative voltage detector.

For example, when the threshold voltage of the FET 23 is −2V, it is increased to about −1.8V. Thereby, before the voltage $V_{SS}$ becomes sufficiently low (−2V), i.e., at −1.8V, current flowing between the source and the drain of the FET 23 is concentrated, whereby the signal CTL10 for controlling the switch SW1 becomes high.

In the fourth embodiment of invention, the FET 23 is identical to the amplifier FET 1 in gate length, the depth of the channel layer, and the dopant concentration in the channel layer, and has a gate width larger than 10 μm, so that the FET 23 and the amplifier FET 1 have the same threshold voltage. Also in this sixth embodiment of the invention, the FET 23 is identical to the amplifier FET 1 in gate length, the depth of the channel layer, and the dopant concentration in the channel layer, but the gate width of the FET 23 is narrower than 10 μm.

Generally, in an FET on a GaAs substrate, when the gate width is wider than 10 μm, the threshold voltage $V_{th}$ has no dependence on the gate width, i.e., the threshold voltage $V_{th}$ is fixed. However, when the gate width is narrower than 10 μm, the threshold voltage $V_{th}$ increases. This is called the narrow channel effect.

In this sixth embodiment of the invention, the gate width of the FET 23 shown in FIG. 4 is narrower than 10 μm and than the gate width of the amplifier FET 1 so that the threshold voltage $V_{th}$ of the FET 23 is higher than the threshold voltage of the amplifier FET 1. However, the gate width of the amplifier FET 1 is usually wider than 0.1 mm.

According to the sixth embodiment of the invention, a capacitor C for stabilizing the power supply voltage is connected to the power supply terminal $V_{DD1}$ of the power amplifier 1 as in the IC device according to the fifth embodiment of the invention, and the threshold voltage of the FET included in the negative voltage detector is higher than the threshold voltage of the FET in the negative voltage detector according to the fourth embodiment. Therefore, after the power supply voltage is applied to the power supply terminal $V_{DD2}$ of the IC device, the time interval during which the control signal CTL10 becomes high, the switch SW1 turns on, and the power supply voltage is applied to the power amplifier 1 is reduced as compared with the IC device including the negative voltage detector according to the fourth embodiment. So, the power supply voltage can be applied just before the operation of the power amplifier 1, whereby unwanted power dissipation is avoided. Further, since the gate width of the FET included in the negative voltage detector is reduced as compared with the negative voltage detector according to the fourth embodiment and the number of elements is reduced as compared with the negative voltage detector according to the fifth embodiment, the size and the cost of the IC device are reduced.

[Embodiment 7]

A description is given of an IC device according to a seventh embodiment of the present invention. A negative voltage detector according to this seventh embodiment is identical to the negative voltage detector according to the sixth embodiment except that the gate length of the FET included in the negative voltage detector is longer than 2 μm and than the gate length of the amplifier FET 1 in order to make the threshold voltage of the FET higher than the threshold voltage according to the sixth embodiment. The circuit structure of the IC device according to this seventh embodiment is identical to the IC device shown in FIG. 5 according to the fifth embodiment except for the internal structure of the negative voltage detector.

Generally, in an FET on a GaAs substrate, when the gate length is longer than 2 μm, the threshold voltage has no dependence on the gate length, i.e., it is fixed. However, when the gate length is shorter than 2 μm, the threshold voltage $V_{th}$ decreases with a reduction in the gate length. This is called the short channel effect. So, an FET having a gate length longer than 2 μm has a threshold voltage higher than that of an FET having a gate length shorter than 1.5 μm. Usually, an FET having a gate length shorter than 1.5 μm is used as the power amplifier 1 to increase the gain and secure a desired output power. Therefore, in the negative voltage detector shown in FIG. 4, when the gate width of the FET 23 is narrower than 10 μm and than the gate width of the amplifier FET 1 and the gate length of the FET 23 is longer than 2 μm, an FET having a threshold voltage higher than the threshold voltages of the amplifier FET 1 and the FET included in the negative voltage detector according to the sixth embodiment is obtained. Since the short channel effect occurs in the same way as mentioned above in a MOSFET on an Si substrate, this seventh embodiment of the invention can be applied to an Si-MOSFET.

According to this seventh embodiment of the present invention, a capacitor C for stabilizing a power supply voltage is connected to the power supply terminal $V_{DD1}$ of the power amplifier 1 as in the IC device according to the fifth embodiment of the invention, and the threshold voltage of the FET included in the negative voltage detector is higher than the threshold voltage of the FET in the negative voltage detector according to the fourth embodiment. Therefore, after the power supply voltage is applied to the power supply terminal $V_{DD2}$ of the IC device, the time interval during which the control signal CTL10 becomes high, the switch SW1 turns on, and the power supply voltage is applied to the power amplifier 1 is reduced as compared with the IC device including the negative voltage detector according to the fourth embodiment. So, the power supply voltage can be applied just before the operation of the power amplifier 1, whereby unwanted power dissipation is avoided. Further, since the gate width of the FET included in the negative voltage detector is reduced as compared with the negative voltage detector according to the fourth embodiment and the number of elements is reduced as compared with the negative voltage detector according to the fifth embodiment, the size and the cost of the IC device are reduced.

Furthermore, when an FET having a gate width of about 10 μm is used as the power amplifier 1, a sufficiently high threshold voltage desired for the FET 23 in the negative power detector cannot be obtained solely by making the gate width of the FET 23 narrower than the gate width of the amplifier FET 1. In this seventh embodiment, since the gate length of the FET 23 is longer than the gate length of the amplifier FET 1, a threshold voltage higher than the threshold voltage achieved in the negative voltage detector according to the sixth embodiment is realized.

In the foregoing description, emphasis has been placed upon a negative voltage generator and a negative voltage detector for supplying a negative voltage to a power amplifier. However, a negative voltage generator and a negative voltage detector according to the present invention can be employed in other circuits that need a negative voltage, such as a high frequency changing switch and a low noise amplifier.

What is claimed is:

1. An integrated circuit device comprising:

a power amplifier comprising a field effect transistor;

a negative voltage generator for supplying a negative voltage to the power amplifier;

an internal switch;

a positive power supply terminal for receiving a positive power supply voltage through an external switch and applying the positive power supply voltage to the negative voltage generator and, through the internal switch, to a power supply terminal of the power amplifier; and a negative voltage detector for detecting the voltage output from the negative voltage generator and sending a control signal to the internal switch so that the internal switch is closed when the voltage output from the negative voltage generator is lower than a threshold negative voltage and the internal switch is open when the voltage output from the negative voltage generator is higher than the threshold negative voltage.

2. An integrated circuit device comprising:

a power amplifier having a power supply terminal;

a negative voltage generator for supplying a negative voltage to the power amplifier;

a first power supply terminal for receiving a positive power supply voltage through an external switch and supplying the positive power supply voltage to a power supply terminal of the power amplifier;

a second power supply terminal for receiving the positive power supply voltage through a second external switch and supplying the positive power supply voltage to the negative voltage generator; and a negative voltage detector for detecting the voltage output from the negative voltage generator and sending a control signal to the first external switch so that the first external switch is closed when the voltage output from the negative voltage generator is lower than a threshold negative voltage and the first external switch is open when the voltage output from the negative voltage generator is higher than the threshold negative voltage.

3. The integrated circuit device of claim 1 comprising a capacitor connected between the power supply terminal of the power amplifier and ground.

4. The integrated circuit device of claim 1 wherein the negative voltage detector comprises:

an input circuit comprising:

a normally off first field effect transistor having a gate, a drain, and a source receiving the voltage output from the negative voltage generator, a first load circuit connected between the drain of the first field effect transistor and the positive power supply terminal, and a voltage drop circuit producing a voltage drop so that the voltage at the gate becomes lower than ground, and an inverter circuit comprising:

a normally off second field effect transistor having a gate, a drain, and a source, the gate being connected to the drain of the first field effect transistor, and the drain outputting the control signal, and a second load circuit connected between the drain of the second field effect transistor and the positive power supply terminal.

5. The integrated circuit device of claim 4 wherein the voltage drop circuit comprises a plurality of diodes connected in series with anodes connected to the ground.

6. The integrated circuit device of claim 4 wherein the voltage drop circuit comprises a diode and a third field effect transistor having a gate and a drain connected together, the diode and transistor are connected in series with the drain of the transistor connected to a cathode of the diode, and an anode of the diode connected to the ground.

7. The integrated circuit device of claim 1 wherein the field effect transistor of the power amplifier has a channel layer with a depth and a dopant concentration, a gate width, and a gate length, and the negative voltage detector is an inverter circuit comprising:

a normally on field effect transistor including a drain, a gate, and a channel layer, the channel layer of the normally on field effect transistor having the same depth and dopant concentration as the field effect transistor of the power amplifier, the gate receiving the voltage output from the negative voltage generator, and the drain outputting the control signal; and a load circuit connected between the drain of the normally on field effect transistor and the positive power supply terminal.

8. The integrated circuit device of claim 7 wherein the normally on field effect transistor has the same gate length, as the field effect transistor of the power amplifier, and a gate width larger than 10 μm.

9. The integrated circuit device of claim 7 wherein the normally on field effect transistor has the same gate length as the field effect transistor of the power amplifier, and a gate width narrower than the gate width of the field effect transistor of the power supply amplifier and longer than 2 μm.

10. The integrated circuit device of claim 7 wherein the normally on field effect transistor has a gate length longer than the gate length of the field effect transistor of the power amplifier and longer than 2 μm.

* * * * *